(12) United States Patent
Ding et al.

(10) Patent No.: US 11,538,993 B2
(45) Date of Patent: Dec. 27, 2022

(54) EVAPORATING MASK PLATE, EVAPORATING MASK PLATE SET, EVAPORATING SYSTEM, AND ALIGNMENT TEST METHOD

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Weiwei Ding, Beijing (CN); Jianpeng Wu, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 1127 days.

(21) Appl. No.: 16/068,995

(22) PCT Filed: Jan. 5, 2018

(86) PCT No.: PCT/CN2018/071549
§ 371 (c)(1),
(2) Date: Jul. 10, 2018

(87) PCT Pub. No.: WO2018/223695
PCT Pub. Date: Dec. 13, 2018

(65) Prior Publication Data
US 2021/0280788 A1   Sep. 9, 2021

(30) Foreign Application Priority Data

Jun. 5, 2017 (CN) .......................... 201710414315.4

(51) Int. Cl.
*H01L 51/00* (2006.01)
*C23C 14/04* (2006.01)
(Continued)

(52) U.S. Cl.
CPC ........ *H01L 51/0011* (2013.01); *C23C 14/042* (2013.01); *C23C 14/12* (2013.01);
(Continued)

(58) Field of Classification Search
CPC ....... H01L 51/001; H01L 51/00; H01L 51/12; H01L 51/56; H01L 51/61; H01L 51/0031
See application file for complete search history.

(56) References Cited

U.S. PATENT DOCUMENTS

2003/0221614 A1   12/2003   Kang et al.
2006/0011136 A1   1/2006   Yamazaki et al.
(Continued)

FOREIGN PATENT DOCUMENTS

CN   104808434 A   7/2015
CN   204803392 U   11/2015
(Continued)

OTHER PUBLICATIONS

International Search Report and Written Opinion for Application No. PCT/CN2018/071549, dated Mar. 23, 2018, 11 Pages.
(Continued)

*Primary Examiner* — Xiaoming Liu
(74) *Attorney, Agent, or Firm* — Brooks Kushman P.C.

(57) ABSTRACT

An evaporating mask plate, an evaporating mask plate set and an evaporating system are provided. The evaporating mask plate includes a mask pattern plate. The evaporating mask pattern plate includes an evaporating area and a test area located around the evaporating area. The test area is provided with at least two test element groups located in
(Continued)

different regions of the test area, and each test element group includes at least one test hole for alignment.

19 Claims, 3 Drawing Sheets

(51) Int. Cl.
    *C23C 14/12*     (2006.01)
    *C23C 14/24*     (2006.01)
    *H01L 51/56*     (2006.01)

(52) U.S. Cl.
    CPC ............ *C23C 14/24* (2013.01); *H01L 51/001* (2013.01); *H01L 51/0012* (2013.01); *H01L 51/0031* (2013.01); *H01L 51/56* (2013.01)

(56) References Cited

U.S. PATENT DOCUMENTS

| | | | |
|---|---|---|---|
| 2012/0266813 A1 | 10/2012 | Hong | |
| 2013/0273746 A1 | 10/2013 | Kawato et al. | |
| 2015/0059643 A1 | 3/2015 | Du et al. | |
| 2016/0322571 A1 | 11/2016 | Lee et al. | |
| 2020/0017951 A1* | 1/2020 | Ikenaga | C21D 1/30 |

FOREIGN PATENT DOCUMENTS

| | | |
|---|---|---|
| CN | 105803389 A | 7/2016 |
| CN | 205844737 U | 12/2016 |
| CN | 206015074 U | 3/2017 |
| JP | 5319024 B2 | 10/2013 |
| KR | 20120120703 A | 11/2012 |

OTHER PUBLICATIONS

First Office Action for Korean Application No. 10-2019-7024073, dated Nov. 5, 2020, 5 Pages.

Extended European Search Report for European Application No. 18813393.8, dated Mar. 26, 2021, 6 Pages.

First Office Action for Japanese Application No. 2019-543027, dated Sep. 28, 2021, 3 Pages.

* cited by examiner

EVAPORATING MASK PLATE, EVAPORATING MASK PLATE SET, EVAPORATING SYSTEM, AND ALIGNMENT TEST METHOD

CROSS-REFERENCE TO RELATED APPLICATION APPLICATIONS

This application is the U.S. national phase of PCT Application No. PCT/CN2018/071549 filed on Jan. 5, 2018, which claims priority to Chinese Patent Application No. 201710414315.4 filed on Jun. 5, 2017, which are incorporated herein by reference in their entireties.

TECHNICAL FIELD

The present disclosure pertains to the field of display technologies, and in particular to an evaporating mask plate, an evaporating mask plate set, an evaporating system and an alignment test method.

BACKGROUND

An organic light-emitting diode (OLED) is a widely used display device, which forms an exciton using a combination of an electron with a hole, so as to generate light emission, and obtains different luminance by adjusting a size of a driving current. This luminous manner has significant advantages of a simple structure, self-illumination, dispensation with a backlight source, a light and thin display device, short response time, high speed, a wide viewing angle approaching 180°, low energy consumption, a high contrast ratio, excellent thermal adaptability, or the like.

Currently, the OLED device is mainly prepared by a vacuum thermal evaporating process which has moderate complexity, and makes the OLED device have a long service life, so has found wide applications. In this preparation method, a fine metal mask (FMM) is a key structure to ensure that an organic luminescent material is accurately evaporated to a design position. The FMM includes an opening corresponding to a display area. During the evaporation, heated and evaporated organic material molecules pass through the opening in the FMM and then deposited to the opening of a pixel define layer (PDL) of a back plate, thereby forming a predetermined pattern.

The FMM has a fine structure, and its opening has a size of only tens of micrometers. Therefore, an accurate test alignment needs to be performed on an evaporating pattern by using a test element group (TEG), so as to avoid poor color mixture due to poor alignment, and ensure the final display effects. In a related art, the evaporation pattern of each layer usually corresponds to one mask plate, and a pixel position alignment test element group (simply referred to as PPA TEG) is arranged in the mask plate. High costs of mold making and processing the FMM lead to a relatively high process cost.

As such, it is a technical problem to be urgently solved of how to prevent resource waste of the mask plate caused by the pixel position alignment.

SUMMARY

The embodiments of the present disclosure provide an evaporating mask plate, including a mask pattern plate. The mask pattern plate includes an evaporating area and a test area located around the evaporating area; the test area is provided with at least two test element groups located in different regions of the test area, and each test element group includes at least one test hole for alignment.

The test holes in different test element groups have different shapes.

Each test element group includes a plurality of test holes; the test holes in the same test element group have the same shape.

Each the test element group includes a plurality of test holes; the test holes in the same test element group have any one of the shapes of rectangle, circle and triangle.

The test holes in the same test element group are arranged at one side or plural sides of the evaporating area.

The mask pattern plate further includes a grasping area, a partially-etched area and a fully-etched area, wherein the partially-etched area does not go through the mask pattern plate; the fully-etched area goes through the mask pattern plate; with respect to the partially-etched area, the fully-etched area is close to a central region of the mask pattern plate.

The partially-etched area has a first shape, and the fully-etched area has a second shape different from the first shape.

The first shape is a part of the circle; the second shape is a strip.

The partially-etched area and the fully-etched area are arranged at intervals, and the partially-etched area has an area larger than the fully-etched area.

The evaporating mask plate further includes a frame and a shielding strip. The shielding strip is arranged in the frame, the mask pattern plate is arranged above the shielding strip and the frame, and the shielding strip makes the test hole in only one test element group of the mask pattern plate be in a penetrating state.

The shielding strip is provided with an aperture at a region corresponding to the test hole in the penetrating state, and the aperture has a size greater than the test hole.

The shielding strip is provided with a notch being concave with respect to an edge of a region corresponding to the test hole in the penetrating state, and the notch exposes the test hole in the penetrating state.

The mask pattern plate is in welded connection with the shielding strip and the frame respectively.

The mask pattern plate includes a plurality of evaporating areas and a plurality of test areas; the plurality of evaporating areas and the plurality of test areas are alternately arranged in a length direction of the mask pattern plate.

The embodiments of the present disclosure further provide an evaporating mask plate set, for performing mask on a plurality of film layers with the same evaporating pattern in the same device. The evaporating mask plate set includes evaporating mask plates, the number of which is the same as the number of the plurality of film layers with the same evaporating pattern.

Each evaporating mask plate is provided with the test element groups, the number of which is at least the same as the number of the plurality of film layers with the same evaporating pattern.

In the Nth evaporating mask plate, corresponding to the Nth film layer of the plurality of film layers, among the evaporating mask plates, only the test hole in the test element group corresponding to the Nth film layer is in the penetrating state, wherein N is greater than or equal to 1, and is less than or equal to the number of the plurality of film layers.

The embodiments of the present disclosure further provide an evaporating system, including the above-mentioned evaporating mask plate set.

The evaporating system further includes a chamber; wherein the evaporating mask plate set is arranged in the chamber.

The embodiments of the present disclosure further provide an alignment test method for performing an alignment test on a plurality of film layers with the same evaporating pattern in the same device by using an evaporating mask plate set. The evaporating mask plate set includes: a plurality of evaporating mask plates, the number of the plurality of evaporating mask plates is the same as the number of the plurality of film layers with the same evaporating pattern; each evaporating mask plate includes a mask pattern plate; the mask pattern plate includes an evaporating area and a test area located around the evaporating area; the test area is provided with the test element groups, the number of which is the same as the number of the plurality of film layers with the same evaporating pattern, the test element groups are located in different regions of the test area, and each test element group includes at least one test hole for alignment. The alignment test method includes: when the alignment test is performed on the Nth film layer by using the Nth evaporating mask plate corresponding to the Nth film layer in the plurality of film layers among the evaporating mask plates, shielding test holes in the test element group of the Nth evaporating mask plate other than the test hole in the test element group corresponding to the Nth film layer, wherein N is greater than or equal to 1, and is less than or equal to the number of the plurality of film layers; and performing the alignment test on the Nth film layer by using the test hole in the test element group corresponding to the Nth film layer in the Nth evaporating mask plate.

DETAILED DESCRIPTION

In order for persons skilled in the art to better understand the technical solution of the present disclosure, the evaporating mask plate, the evaporating mask plate set, the evaporating system and the test method in the embodiment of the present disclosure will be further described in detail with combination of the drawings of the embodiments.

The present disclosure has the following technical concept. For the problem existing in the related art, i.e., in the plurality of evaporating mask plates used when a plurality of film layers with the same pattern is evaporated for devices such as OLED, different structures of the plurality of evaporating mask plates result from different alignment test identifiers of the plurality of evaporating mask plates, which further leads to multiple mold making of the mask plate, thereby increasing costs or causing resource waste of a key glass. In the evaporating mask plate according to the embodiment of the present disclosure, the evaporating area with an opening pattern that is the same as the pattern of the plurality of film layers having the same pattern is reserved, and a plurality of groups of test holes corresponding to different film layers is arranged around the evaporating area, thereby lowering the mold making costs and the process costs.

The embodiments of the present disclosure provide an evaporating mask plate and its corresponding evaporating mask plate set. By arranging a plurality of selectable test element groups, and switching the test holes in the plurality of test element groups, the evaporating mask plate manufactured by the one-time mask plate mold making is suitable for evaporating each layer in a plurality of film layers with the same pattern, which greatly lowers the mold making and processing costs of the evaporating mask plate, and thus the process costs.

Figure 1A:
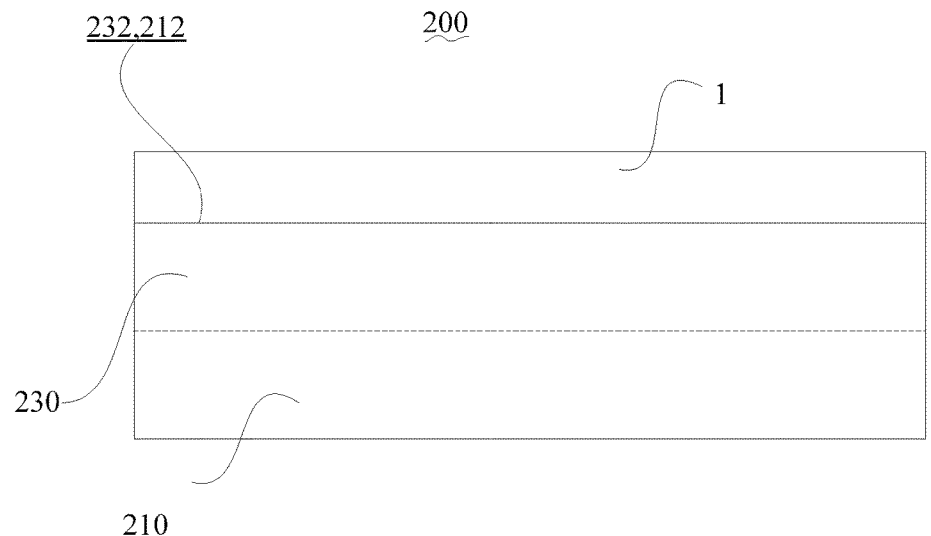
FIG. 1a is a structural schematic diagram of an evaporating mask plate according to one embodiment of the present disclosure.
Figure 1B:
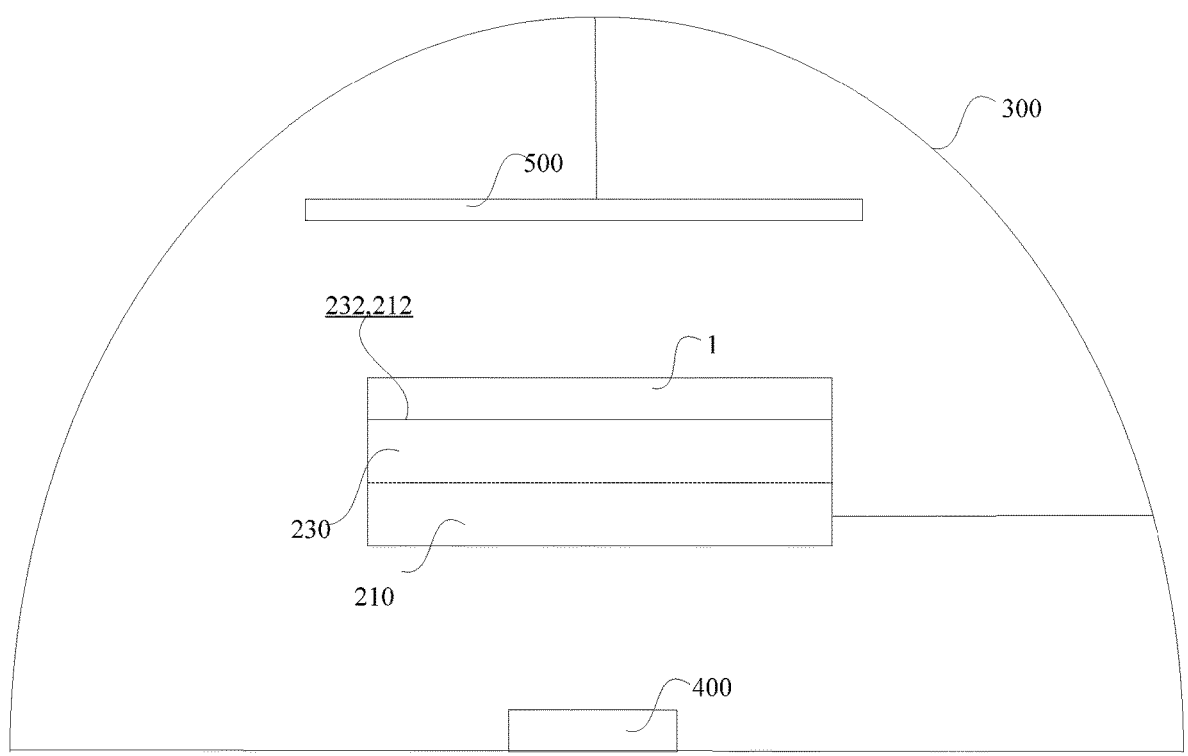
FIG. 1b is a structural schematic diagram of an evaporating system according to one embodiment of the present disclosure.

FIG. 1a is a structural schematic diagram of an evaporating mask plate according to one embodiment of the present disclosure. FIG. 1b is a structural schematic diagram of an evaporating system according to one embodiment of the present disclosure. The evaporating mask plate 200 shown in FIG. 1a may be an FMM. As shown in FIGS. 1a and 1b, the evaporating mask plate 200 includes a frame 210, a shielding strip 230 (shown in a dashed line in FIG. 1a) and a mask pattern plate 1.

The frame 210 is configured to be fixed with the chamber 300. The shielding strip 230 is arranged in the frame 210, and an upper surface 232 of the shielding strip 230 is flushed with an upper surface 212 of the frame 210. The mask pattern plate 1 is arranged above the shielding strip 230 and the frame 210. In one embodiment, the mask pattern plate 1 may be in welded connection with the shielding strip 230 and the frame 210 respectively. By welding, the components in the evaporating mask plate 200 are connected fixedly, so as to avoid deformation due to evaporation, thereby ensuring the correctness and accuracy of the evaporating pattern.

Figure 1C:
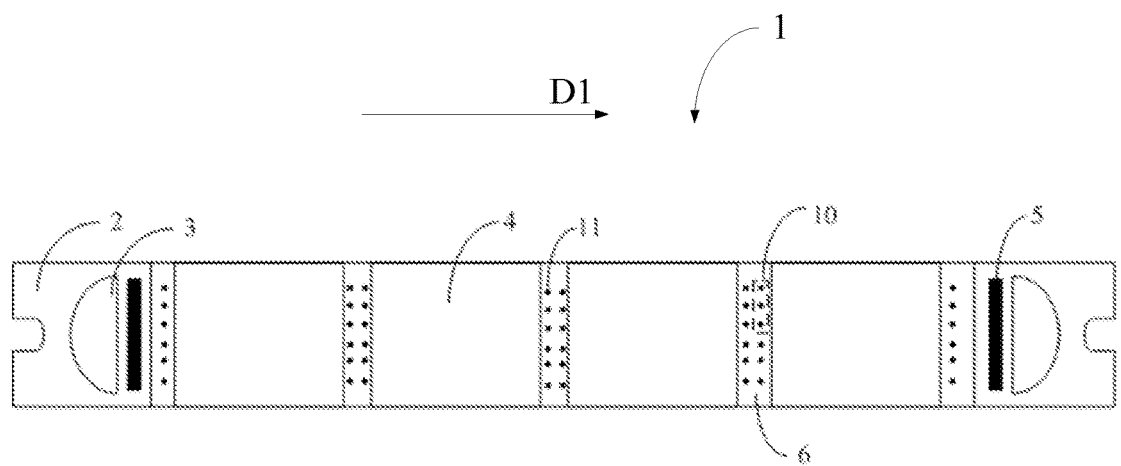
FIG. 1c is a structural schematic diagram of a mask pattern plate for the evaporating mask plate shown in FIG. 1 according to one embodiment of the present disclosure.

FIG. 1c is a structural schematic diagram of a mask pattern plate for the evaporating mask plate 200 shown in FIG. 1a according to one embodiment of the present disclosure. As shown in FIG. 1c, the mask pattern plate 1 includes an evaporating area 4 and a test area 6 located around the evaporating area 4. At least two test element groups 10 are arranged in the test area 6. Each test element group 10 includes at least one test hole 11.

In one embodiment, as shown in FIG. 1c, on the basis of the above-mentioned evaporating area 4 and the test area 6, the mask pattern plate 1 further includes a grasping area 2, a partially-etched area 3 and a fully-etched area 5.

The grasping area 2 is configured to be grasped by an apparatus, so as to weld the mask pattern plate 1 onto the frame 210.

The evaporating area 4 is provided with an opening. During the evaporation by using the evaporating mask plate 200, a target material may pass through the opening of the evaporating area 4 to a back plate pattern area. It should be noted that the shape of the opening in the evaporating area 4 can be designed as needed, and is not limited in the present disclosure.

The partially-etched area 3 is formed on the mask pattern plate 1 in an etching way and does not go through an etching area of the mask pattern plate 1. The partially-etched area 3 may have a first shape, such as a substantial semicircle or a part of the circle.

The fully-etched area 5 goes through the etching area the mask pattern plate 1 in an etching manner. The fully-etched area 5 may have a second shape, such as a strip. The fully-etched area 5 and the partially-etched area 3 have different shapes and etching degrees, so as to balance stress deformation of the mask plate.

Optionally, as shown in FIG. 1c, in the adjacent partially-etched area 3 and the fully-etched area 5, with respect to the partially-etched area 3, the fully-etched area 5 is close to the central region of the mask pattern plate 1, so as to better balance the stress deformation of the evaporating mask plate 200. In addition, the partially-etched area 3 and the fully-etched area 5 are adjacently arranged at intervals, and the partially-etched area 3 may have an area greater than the fully-etched area 5, so as to further balance the stress deformation of the evaporating mask plate 200.

The test element group 10 in the test area 6 is configured to perform the film layer alignment test. For example, when the evaporation is performed by using the evaporating mask plate 200, heated and evaporated organic material molecules pass through the opening of the evaporating area 4 on the mask pattern plate 1 and then deposited to the opening of a pixel define layer (PDL) of a back plate. A plurality of test element groups 10 arranged in the test section 6 forms a position test identifier, for performing the accurate test alignment on the evaporating pattern formed by evaporation using the mask pattern plate 1, each evaporating pattern corresponding to one test element group 10, so as to ensure the correctness and accuracy of the evaporating pattern.

Figure 2:
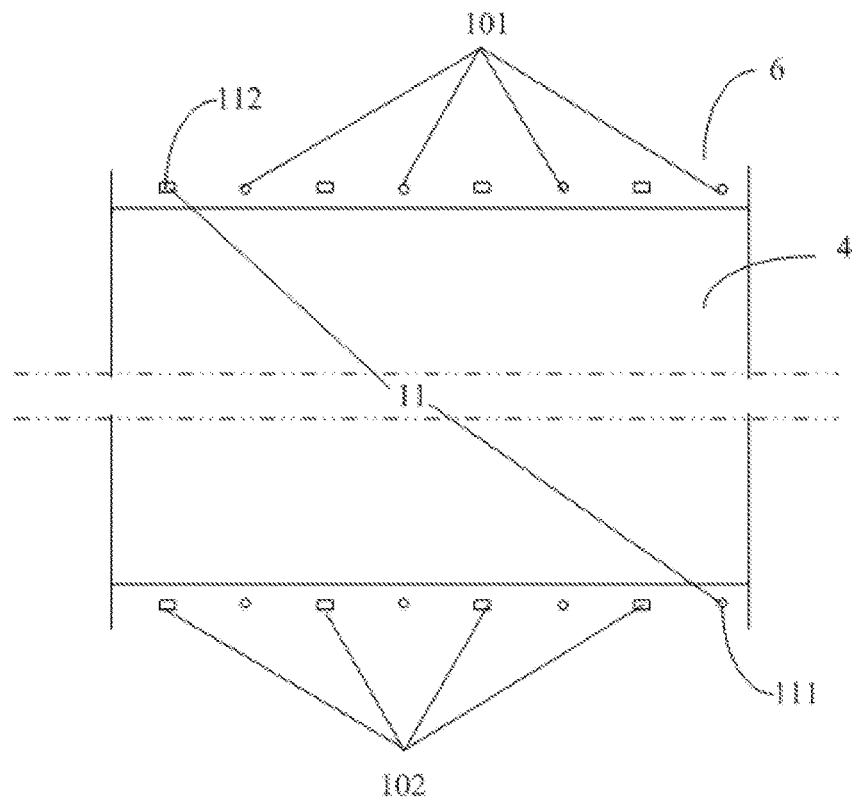
FIG. 2 is a partial enlarged schematic diagram of the mask pattern plate in FIG. 1c.

FIG. 2 is a partial enlarged schematic diagram of the mask pattern plate in FIG. 1c. In the embodiment shown in FIG. 2, the mask pattern plate 1 may include two test element groups, that are the first test element group 101 and the second test element group 102. The first test holes 111 in the first test element group 101 have the same shape. The second test holes 112 in the second test element group 102 have the same shape. The first test holes 111 have a shape different from the second test holes 112. In other words, the test holes 11 in the same test element group 10 have the same shapes, but the test holes 11 in different test element groups 10 have different shapes. In addition, in the plurality of test element groups 10, the test holes 11 may be or not uniformly spaced. Whether the test holes are arranged with the equal interval is not limited, and can be determined according to a practical product.

Optionally, the test holes 11 in the same test element group 10 have any one of the shapes of rectangle, circle or triangle, so as to distinguish from the test holes 11 in different test element groups 10. Additionally, the shapes of the test holes 11 in the same test element group 10 include, but not limited to, rectangle, circle, triangle, etc., so as to improve the working efficiency of technologists. In the embodiment shown in FIG. 2, the first test holes 111 have the shape of circle, and the second test holes 112 have the shape of rectangle. The shapes of the test holes 11 in the same test element group 10 are not limited, as long as the technologist and the test equipment conveniently recognize them.

In the evaporating mask plate according to the embodiments of the present disclosure, the position of the test hole in the test element group is not limited. Optionally, the test holes 11 in the same test element group 10 are arranged in the test area 6 at one side or plural sides of the evaporating area 4, which is convenient for the technologies to select and test during the practical process.

Optionally, in the same test element group 10, at least one test hole 11 is arranged in the test area 6 at one side, so as to perform alignment test at a plurality of positions to ensure the test accuracy. The test holes 11 in different test element groups 10 are all or separately arranged at least one side or plural sides of upper side, lower side, left side or right side of the evaporating area 4, and the number of the test holes 11 at each side may be 1, 2, 3 . . . and is not limited.

In the practical application, as shown in FIG. 1b, the evaporating mask plate 200 is usually fixed in the chamber 300. A target material 400 is arranged below the evaporating mask plate 200, and the back plate 500 to be evaporated is arranged above the evaporating mask plate 200. By setting appropriate process conditions in the chamber 300, the target material 400 is evaporated to the predetermined position on the back plate 500 by the evaporating area 4 in the evaporating mask plate 200.

Figure 3:
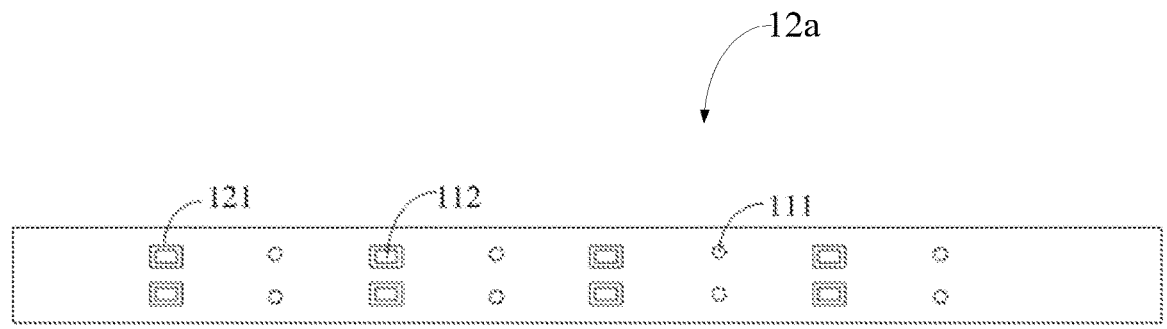
FIG. 3 is a structural schematic diagram of a hole-type shielding strip for the evaporating mask plate shown in FIG. 1 according to one embodiment of the present disclosure.
Figure 4:
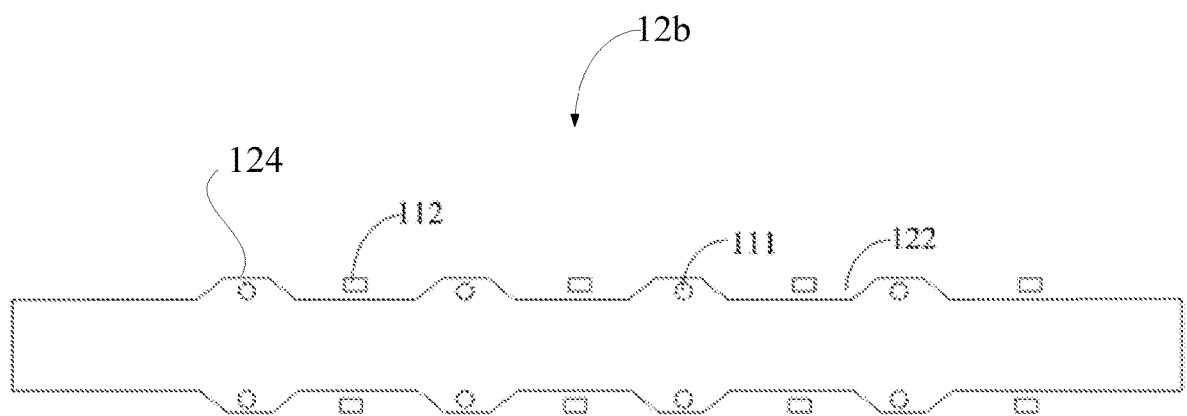
FIG. 4 is a structural schematic diagram of an extended shielding strip for the evaporating mask plate shown in FIG. 1 according to one embodiment of the present disclosure.

FIG. 3 is a structural schematic diagram of a hole-type shielding strip 12a for the evaporating mask plate 200 shown in FIG. 1 according to one embodiment of the present disclosure. FIG. 4 is a structural schematic diagram of an extended shielding strip 12b for the evaporating mask plate shown in FIG. 1 according to one embodiment of the present disclosure. With reference to FIGS. 3, 4, and 1a, the shielding strip 12a/12b may be arranged in the frame 210, and the mask pattern plate 1 is arranged above the shielding strip 12a/12b and the frame 210. In addition, the shielding strip 12a/12b is configured to better support the mask pattern plate 1, while selectively shielding or exposing the different groups of test holes 11 in the mask pattern plate 1, such that the test holes 11 in the only one test element group 10 of the mask pattern plate 1 is in the penetrating state.

As shown in FIG. 3, the shielding strip 12a shields the test hole 11 in such a way that the aperture 121 is arranged at the region corresponding to the test hole 11 of the same test element group 10, and the aperture 121 has a size greater than the test hole 11. For the hole-type shielding strip 12a shown in FIG. 3, the used second test hole 112 of the second test element group 102 is exposed through the aperture 121, whereas the unused first test hole 111 of the first test element group 101 is shielded by the shielding strip 12a (the shielded first test hole 111 is shown in a dashed line).

As shown in FIG. 4, the shielding strip 12b shields the test hole 11 in such a way that a notch 122 is formed at a region corresponding to the test hole 11 of the same test element group 10 and is concave with respect to the edge 124, and the notch 122 exposes the test hole 11 of the same test element group 10. For the extended shielding strip 12b shown in FIG. 4, the unused first test hole 111 of the first test element group 101 is shielded by the shielding strip 12b (the shielded first test hole 111 is shown in a dashed line), whereas the used second test hole 112 of the second test element group 102 is directly exposed.

In the frame 210, a groove receiving an end portion of the shielding strip 230/12a/12b is arranged at the region where the shielding strip 230/12a/12b is arranged, such that when the shielding strip 230/12a/12b is arranged in the frame 210, the upper surface 232 of the shielding strip 230/12a/12b is flushed with the upper surface 212 of the frame 210. Optionally, the mask pattern plate 1 may be in welded connection with the shielding strip 230/12a/12b and the frame 210 respectively. By welding, components in the evaporating mask plate 200 are connected fixedly, so as to avoid deformation due to evaporation, thereby ensuring the correctness and accuracy of the evaporating pattern.

The mask pattern plate 1 shown in FIG. 1c may evaporate a plurality of sub substrates in one big piece of mother glass, thereby improving the process efficiency. The position test identifier formed in the test area 6 during evaporation may be removed or reserved in the subsequent process of cutting the substrate, which is not limited herein.

In addition, as shown in FIG. 1c, when the mask pattern plate 1 includes a plurality of evaporating areas 4 and a plurality of test areas 6, which may be alternately arranged in a first direction D1, such as a length direction of the mask pattern plate 1.

Correspondingly, the embodiments of the present disclosure further provide an evaporating mask plate set based on the above-mentioned evaporating mask plate, for performing mask on different film layers with the same evaporating pattern in the same device structure. This evaporating mask plate set includes the evaporating mask plates, the number of which is the same as the number of the film layers with the same evaporating pattern. In this way, in a plurality of evaporating mask plates for evaporating a plurality of film layers with the same pattern, since the evaporating areas of the plurality of evaporating mask plates have the same evaporating pattern, and the plurality of evaporating mask plates are provided with plural groups of same test holes in the test area. By switching the test holes in the plural test element groups, the evaporating mask plate with the same structure is suitable for the evaporation and alignment test of each layer in different film layers with the same evaporating pattern. Therefore, only one-time mold making is necessary, which greatly lowers the mold making costs.

Optionally, each evaporating mask plate is provided with the test element groups, the number of which is at least the same as the number of the film layers with the same evaporating pattern. Different numbers of mask pattern plates are arranged in the mask plate set, so as to distinctively correspond to the mask plate in different layers.

In use, in the evaporating mask plate for evaporating the corresponding film layer, the evaporating area has the same evaporating mask pattern, and in the test element group of the test area, only the test hole corresponding to the film layer is in the penetrating state.

Hereinafter, the above-mentioned evaporating mask plate and the evaporating mask plate set are below explained in detail by taking the evaporating mask plate suitable for evaporating the OLED device as an example.

In the OLED device of this example, an emission layer (simply referred to as EML) and a hole transport layer (simply referred to as HTL) in a red pixel structure have the same evaporating pattern, the emission layer and the hole transport layer in the green pixel structure have the same evaporating pattern, and the above-mentioned evaporating pattern in the red pixel structure is different from the above-mentioned evaporating pattern in the green pixel structure. Therefore, in the design of the FMM, the emission layer and the hole transport layer in the red pixel structure share one mask plate set to perform evaporation. This mask plate set includes two evaporating mask plates. The first test element group 101 and the second test element group 102 are arranged in each evaporating mask plate. The first test element group 101 is suitable for the position alignment test of the red emission layer (R-EML). The second test element group 102 is suitable for the position alignment test of the red hole transport layer (R-HTL). The test hole 11 in the test element group 10 has a shape of rectangle, circle, triangle, etc. Similarly, the emission layer and the hole transport layer in the green pixel structure share one mask plate set. This mask plate set includes two evaporating mask plates to perform evaporation. The first test element group 101 and the second test element group 102 are arranged in each evaporating mask plate. The first test element group 101 is suitable for the position alignment test of the green emission layer (G-EML). The second test element group 102 is suitable for the position alignment test of the green hole transport layer (G-HTL). The test hole 11 in the test element group 10 has a shape of rectangle, circle, triangle, etc.

When the first test element group 101 is used, in order to prevent the target material from being evaporated onto the back plate via the second test hole 112 in the second test element group 102, the second test hole 112 needs to be shielded by the shielding strip 12a/12b. When the second test element group 102 is used, the first test hole 111 in the first test element group 101 needs to be shielded by the shielding strip 12a/12b. The shielding strip 12a/12b may be any one shown in FIG. 3 or 4, and is selected flexibly when the components of the mask plate are fixed.

Additionally, the evaporating mask plate in the embodiment of the present disclosure can be not only the exemplary FMM, but also an open mask with a relatively large evaporating area pattern, which is not limited herein.

In the current OLED device, although part of the patterns is the same, for example, the emission layer EML or the hole transport layer HTL, since different organic materials need to be adopted or different thicknesses need to be set corresponding to different colors (for example, red R, blue B or green G), the FMM needs to be used in the evaporating process of different layers to finish the evaporation, and the test alignment needs to be performed by setting the test element group respectively, which causes the repeated mold making in the FMM, for example, corresponding to R-EML, R-HTL, G-EML, G-HTL, B-EML in the same OLED device, five mask plates and one evaporating substrate are necessary. However, by adopting the compatible multifunctional evaporating mask plate and its corresponding evaporating mask plate set according to the embodiment of the present disclosure, for the above-mentioned example, since it can be compatible with the evaporation of the organic materials of different layers with the same color in the OLED display device, only three mask plates are needed to perform mold making and processing. In use, only one evaporating substrate is needed, so as to finish the preparation and test of each layer of the whole OLED device, which greatly saves the process costs. Compared with the related art, the compatible multifunctional evaporating mask plate and its corresponding evaporating mask plate set according to the embodiment of the present disclosure may save the mold making expenditure of the two mask plates, which significantly lowers the process costs and effectively solves the problem of resource waste of the mask plate due to the pixel position alignment.

One embodiment of the present disclosure further provides an evaporating system, as shown in FIG. 1b, including a chamber 300 and the above-mentioned evaporating mask plate set arranged in the chamber 300.

In this evaporating system, this evaporating mask plate set greatly reduces the evaporating process cost due to the adoption of the plurality of same evaporating mask plates which have the same evaporating pattern and are provided with a plurality of groups of selectable test holes.

It can be understood that the above embodiments are only exemplary embodiments adopted for illustrating the principles of the present disclosure, but the present disclosure is not limited hereto. Those skilled in the art can make various variations and improvements without departing from the spirit and essence of the present disclosure. These variations and improvements are also intended to be incorporated within the protection scope of the present disclosure.

What is claimed is:

1. An evaporating mask plate, comprising a mask pattern plate;
the mask pattern plate comprises an evaporating area and a test area located around the evaporating area; the test area is provided with at least two test element groups located in different regions of the test area, and each test element group comprises at least one test hole for alignment,
wherein the mask pattern plate further comprises a grasping area, a partially-etched area and a fully-etched area, wherein the partially-etched area does not go through the mask pattern plate; the fully-etched area goes through the mask pattern plate; with respect to the partially-etched area, the fully-etched area is close to a central region of the mask pattern plate.

2. The evaporating mask plate according to claim 1, wherein the test holes in different test element groups have different shapes.

3. The evaporating mask plate according to claim 2, wherein each test element group comprises a plurality of test holes; the test holes in the same test element group have the same shape.

4. The evaporating mask plate according to claim 2, wherein each test element group comprises a plurality of test holes; the test holes in the same test element group have any one of the shapes of rectangle, circle and triangle.

5. The evaporating mask plate according to claim 3, wherein the test holes in the same test element group are arranged at one side or plural sides of the evaporating area.

6. The evaporating mask plate according to claim 1, wherein the partially-etched area has a first shape, and the fully-etched area has a second shape different from the first shape.

7. The evaporating mask plate according to claim 6, wherein the first shape is a part of the circle; the second shape is a strip.

8. The evaporating mask plate according to claim 7, wherein the partially-etched area and the fully-etched area are arranged at intervals, and the partially-etched area has an area larger than that of the fully-etched area.

9. An evaporating mask plate, comprising a mask pattern plate; wherein
the mask pattern plate comprises an evaporating area and a test area located around the evaporating area; the test area is provided with at least two test element groups located in different regions of the test area, and each test element group comprises at least one test hole for alignment,
the evaporating mask plate further comprises a frame and a shielding strip;
wherein the shielding strip is arranged in the frame, the mask pattern plate is arranged above the shielding strip and the frame, and the shielding strip makes the test hole in only one test element group of the mask pattern plate be in a penetrating state.

10. The evaporating mask plate according to claim 9, wherein the shielding strip is provided with an aperture at a region corresponding to the test hole in the penetrating state, and the aperture has a size greater than that of the test hole.

11. The evaporating mask plate according to claim 9, wherein the shielding strip is provided with a notch being concave with respect to an edge of a region corresponding to the test hole in the penetrating state, and the notch exposes the test hole in the penetrating state.

12. The evaporating mask plate according to claim 9, wherein the mask pattern plate is in welded connection with the shielding strip and the frame respectively.

13. The evaporating mask plate according to claim 9, wherein the mask pattern plate comprises a plurality of evaporating areas and a plurality of test areas; the plurality of evaporating areas and the plurality of test areas are alternately arranged in a length direction of the mask pattern plate.

14. An evaporating mask plate set, for performing mask on a plurality of film layers with the same evaporating pattern in the same device, comprising: the evaporating mask plates according to claim 1, the number of the evaporating mask plates is the same as the number of the plurality of film layers with the same evaporating pattern.

15. The evaporating mask plate set according to claim 14, wherein each evaporating mask plate is provided with the test element groups, the number of the test element groups is at least the same as the number of the plurality of film layers with the same evaporating pattern.

16. The evaporating mask plate set according to claim 14, wherein in the Nth evaporating mask plate, corresponding to the Nth film layer of the plurality of film layers, among the evaporating mask plates, only the test hole in the test element group corresponding to the Nth film layer is in the penetrating state, wherein N is greater than or equal to 1, and is less than or equal to the number of the plurality of film layers.

17. An evaporating system, comprising the evaporating mask plate set according to claim 14.

18. The evaporating system according to claim 17, further comprising a chamber; wherein the evaporating mask plate set is arranged in the chamber.

19. An alignment test method for performing an alignment test on a plurality of film layers with the same evaporating pattern in the same device by using an evaporating mask plate set,
wherein the evaporating mask plate set comprises: a plurality of evaporating mask plates, the number of the plurality of evaporating mask plates is the same as the number of the plurality of film layers with the same evaporating pattern; each evaporating mask plate comprises a mask pattern plate; the mask pattern plate comprises an evaporating area and a test area located around the evaporating area; the test area is provided with the test element groups, the number of the test element groups is the same as the number of the plurality of film layers with the same evaporating pattern, the test element groups are located in different regions of the test area, and each test element group comprises at least one test hole for alignment, the mask pattern plate further comprises a grasping area, a partially-etched area and a fully-etched area, wherein the partially-etched area does not go through the mask pattern plate; the fully-etched area goes through the mask pattern plate; with respect to the partially-etched area, the fully-etched area is close to a central region of the mask pattern plate;
the alignment test method comprises:
when the alignment test is performed on the Nth film layer by using the Nth evaporating mask plate corresponding to the Nth film layer in the plurality of film layers among the evaporating mask plates, shielding test holes in the test element group of the Nth evaporating mask plate other than the test hole in the test element group corresponding to the Nth film layer, wherein N is greater than or equal to 1, and is less than or equal to the number of the plurality of film layers; and performing the alignment test on the Nth film layer by using the test hole in the test element group corresponding to the Nth film layer in the Nth evaporating mask plate.

* * * * *